United States Patent [19]
Tomioka et al.

[11] Patent Number: 5,885,347
[45] Date of Patent: Mar. 23, 1999

[54] APPARATUS AND METHOD FOR LIFTING SINGLE CRYSTALS

[75] Inventors: Junsuke Tomioka; Hiroshi Inagaki; Ayumi Suda; Toshimichi Kubota, all of Hiratsuka, Japan

[73] Assignee: Komatsu, Ltd., Kanagawa, Japan

[21] Appl. No.: 15,132

[22] Filed: Jan. 29, 1998

[30] Foreign Application Priority Data

Jan. 29, 1997 [JP] Japan .................................. 9-028260

[51] Int. Cl.⁶ .................................................. B01D 53/02
[52] U.S. Cl. ............................ 117/218; 117/15; 117/38; 117/39; 117/202
[58] Field of Search .............................. 117/38, 39, 218, 117/219, 202, 15

[56] References Cited

U.S. PATENT DOCUMENTS

| 3,865,554 | 2/1975 | Wenckus et al. | 117/15 |
| 4,936,947 | 6/1990 | Mackintosh | 117/15 |
| 5,126,113 | 6/1992 | Yamagishi et al. | 117/218 |

*Primary Examiner*—Benjamin Utech
*Assistant Examiner*—Kin-Chan Chen
*Attorney, Agent, or Firm*—Welsh & Katz, Ltd.

[57] ABSTRACT

The object of this invention is to provide a method and a device for manufacturing semiconductor single crystals by the CZ method in response to the increase in the weight of semiconductor single crystal produced. The necked portion formed beneath the reduced portion can be held and the single crystal under lifting can be re-melted.

7 Claims, 9 Drawing Sheets

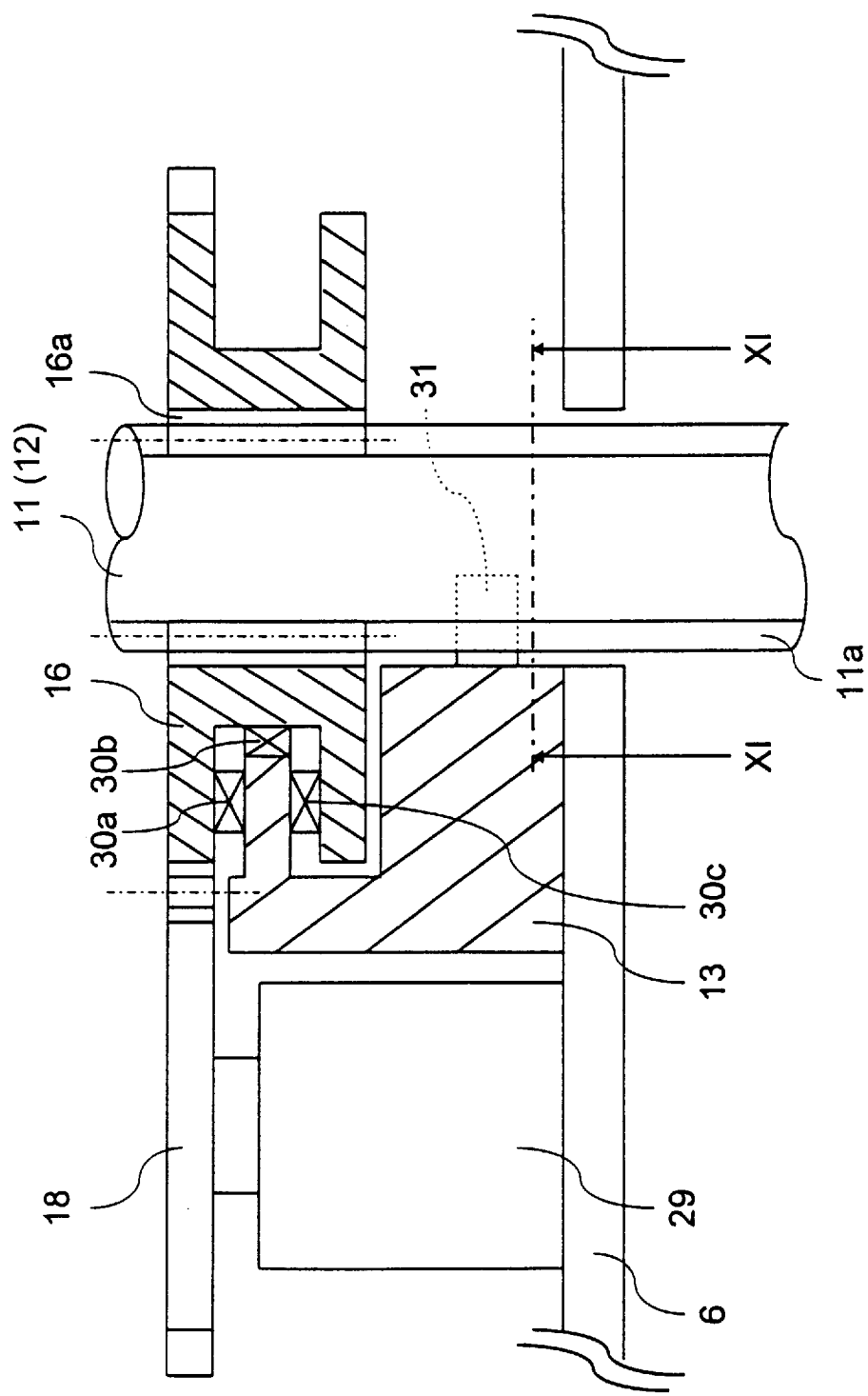

APPARATUS AND METHOD FOR LIFTING SINGLE CRYSTALS

BACKGROUND OF THE INVENTION

1. Field of the Invention

This invention relates to a method and a device for lifting single crystals, said device of which is installed in semiconductor single-crystal manufacturing equipment that utilizes the Czochralski(CZ) method. The method and the device are especially adaptable for lifting heavy semiconductor single crystals.

2. Description of the Related Art

Conventionally, silicon single crystal is produced by the CZ method. In the CZ method, polycrystalline silicon is deposited into a quartz crucible of a single-crystal manufacturing apparatus, then the polycrystalline silicon is heated until it melts by way of heaters disposed around the quartz crucible, subsequently a seed crystal installed within a seed holder is dipped into the melted liquid. Then, the seed holder and the quartz crucible are respectively driven to rotate in the same or opposite directions. At the same time, the seed holder is lifted to grow a single crystal of predetermined diameter and length.

In the seed crystal, dislocation will arise due to the heat shock occurring at the time of dipping it into melted liquid. In order to stop propagation of dislocation from the seed crystal to the single crystal that is to be grown, a reduced portion with diameter from 1 to 4 mm is grown beneath the seed crystal so as to release the dislocation to the surface of the reduced portion. After making certain that the propagation of dislocation has been stopped, a shoulder is formed and the single crystal is enlarged to a predetermined diameter. Then, the lifting operation is shifted to that of forming the body of the single crystal.

In recent years, following the enlargement of single crystals, the weight of an individual single crystal has increased, and the strength of the reduced portion has nearly reached its limit. To solve the problem, a necked portion with a diameter larger than that of the reduced portion is formed on the top of the shoulder when the propagation of dislocation has been stopped by way of the reduction process. It is possible to hold the single crystal by the necked portion so as to prevent breakage of the reduced portion. Alternatively, means are taken to prevent dropping of the single crystal even if the reduced portion breaks. For example, in the single-crystal lifting device disclosed in Examined Japanese Publication NO. 5-65477, 3–4 clamp arms capable of being driven to open or close are engaged with the necked portion of a single crystal so as to suspend the single crystal. In addition, in the single-crystal lifting device disclosed in Examined Japanese Publication NO.7-103000, a plurality of claws engaging with the necked portion of a single crystal are provided. The single crystal is suspended by utilizing a plurality of holding levers capable of being driven to open or to close by their ascending or descending movement and a ring used for preventing opening of the holding levers. Furthermore, in the single-crystal lifting device disclosed in Examined Japanese Publication NO.7-515, a plurality of claws retained at a predetermined angle are provided at the lower end of an engaging holder capable of being driven to ascend or descend. The claws are engaged with the necked portion of a single crystal so as to suspend the single crystal.

However, in the single-crystal lifting device disclosed in Examined Japanese Publication NO. 5-65477, the clamp arm will be driven to open when the weight of the single crystal increases, and there is the danger of dropping of the single crystal during the lifting operation. In the single-crystal lifting devices disclosed in Examined Japanese Publication NO. 7-515 and No.7-103000, there is the danger that the single crystal being lifted might convert into a polycrystal due to the mechanical shock or vibration induced in the process of clamping the single crystal. Furthermore, it is impossible to take the single crystal off from the clamping means,, once the single crystal has been clamped and installed in the main chamber. Thus, even if polycrystallization of the single crystal being lifted or dislocation has occurred, it is impossible to re-melt the single crystal.

SUMMARY OF THE INVENTION

In view of the above disadvantages, the object of the present invention is to provide a device and a method for lifting single crystals in response to the weight increase of semiconductor single crystal produced by the CZ method. According to this invention, adding conventional reduced portions, specifically, the clamping means, by which the necked portion formed beneath the reduced portion can be held and the single crystal under lifting can be re-melted.

To achieve the above object, this invention is characterized in that the single-crystal lifting device is installed on semiconductor single-crystal manufacturing equipment that utilizes the CZ method, and the necked portion formed on the top of the shoulder of the single crystal is held by at least two holding rods, wherein said holding rods are suspended on a guide shaft to enable them to swing in the same direction on parallel vertical planes.

According to the above-described structure, the holding rods, which hold the necked portion of the single crystal so as to prevent breakage of the reduced portion, are suspended on the guide shaft. Therefore, in the processes of raising, lowering, or swinging the holding rods, or clamping the necked portion of the single crystal, the amount of vibration induced is small. This prevents any adverse influence on the single crystal being lifted. Furthermore, when the holding rods are driven to lower close to the necked portion, at least two holding rods are swung in the same direction from the vertical attitude so as not to collide with the single crystal. The holding rods are kept at said swung attitude until they descend to a predetermined location, then the holding rods return to the vertical attitude so as to hold the necked portion.

Furthermore, the single-crystal lifting device of this invention is characterized in that at least two holding rods are capable of being individually controlled to ascend or descend with respect to the force-bar, and each of the force-bar and the holding rods are provided with weight sensors.

Should the necked portion become asymmetric with the centerline of the lifting axle, the load exerted on each of at least two holding rods will be different from the others. This will incur the danger of breaking the necked portion. It is possible to prevent breakage of the necked portion by controlling the increase of the weight of each holding rod, according to the detected values of the weight sensors. Furthermore, the timing of holding the single crystal by holding rods can be determined by detecting the weight of the single crystal via the weight sensor installed on the force-bar. In addition, the load distribution between the reduced portion of the single crystal and the holding rods can also be adjusted according to the detected value of each weight sensor.

The single-crystal lifting device of this invention is characterized in that shock-absorbing material is provided on the portions of the holding rods, which are designed to come in contact with the necked portion of the single crystal.

By installing shock-absorbing material on the holding rods, mechanical shock or vibration can be dampened easily, and lifting of single crystals can also be smoothly performed.

The single-crystal lifting device of this invention is characterized in that a plate spring is interposed within the middle portion of each holding rod.

Plate spring is capable of absorbing vibration in the vertical direction. Therefore, it is adaptable for lifting single crystals, especially those having asymmetrical necked portions.

The single-crystal lifting device of this invention is characterized in that the portions of the holding rods, which are designed to come in contact with the necked portion of the single crystal are made of a shape memory alloy.

When the single crystal is lifted to an elevation where the temperature of the necked portion drops to a value lower than the transformation point of the shape memory alloy, the holding rods engage with the necked portion. Should re-melting the single crystal be necessary, the holding rods are lowered in the state of keeping engaged with the necked portion. The bending portions of the shape memory alloy will extend to release the necked portion when the holding rods descend to the location where the temperature is higher than the transformation point of the shape memory alloy.

Furthermore, the method for lifting single crystals according to this invention is characterized in that when the detected value coming from the weight sensor suspending the force-bar reaches a preset value, the holding rods swung a preset angle with respect to the force-bar are lowered to a predetermined location; then the holding rods are directed to return to the vertical attitude; and subsequently the holding rods are guided to insert into the necked portion while maintaining a clearance existing between the necked portion and the holding rods; and then the holding rods engaged with the necked portion.

According to the above-described method, the holding rods can hold the single crystal being lifted when the single crystal reaches a preset weight, and the holding timing will not be missed. Furthermore, collision between the necked portion and the holding rods can be avoided, there by preventing breakage of the necked portion of the single crystal incurred by the mechanical shock during the process of holding.

Furthermore, the method for lifting single crystals according to this invention is characterized in that in the process of holding the single crystal by the holding rods, the ascending of the holding rods is controlled according to the results detected by the weight sensors installed on the holding rods.

According to the above-described method, the load exerted on each holding rod is detected by the weight sensors installed thereon. While raising the holding rods, the load distribution is controlled to be always uniform from the beginning of holding the necked portion to the end of the lifting operation. Therefore, the single crystal can be steadily lifted without any stress concentration occurring in the necked portion. Furthermore, the load exerted on the reduced portion of the single crystal can be calculated according to the detected values of weight sensors installed respectively on the force-bar and the holding rods and can be controlled.

BRIEF DESCRIPTION OF THE DRAWINGS

The present invention can be more fully understood by reading the subsequent detailed description and examples with references made to the accompanying drawings, wherein:

FIG. 10 is a cross sectional view of a rising/lowering mechanism for the holding rod 11 or 12.

DETAILED DESCRIPTION OF THE PREFERRED EMBODIMENTS

Figure 1:
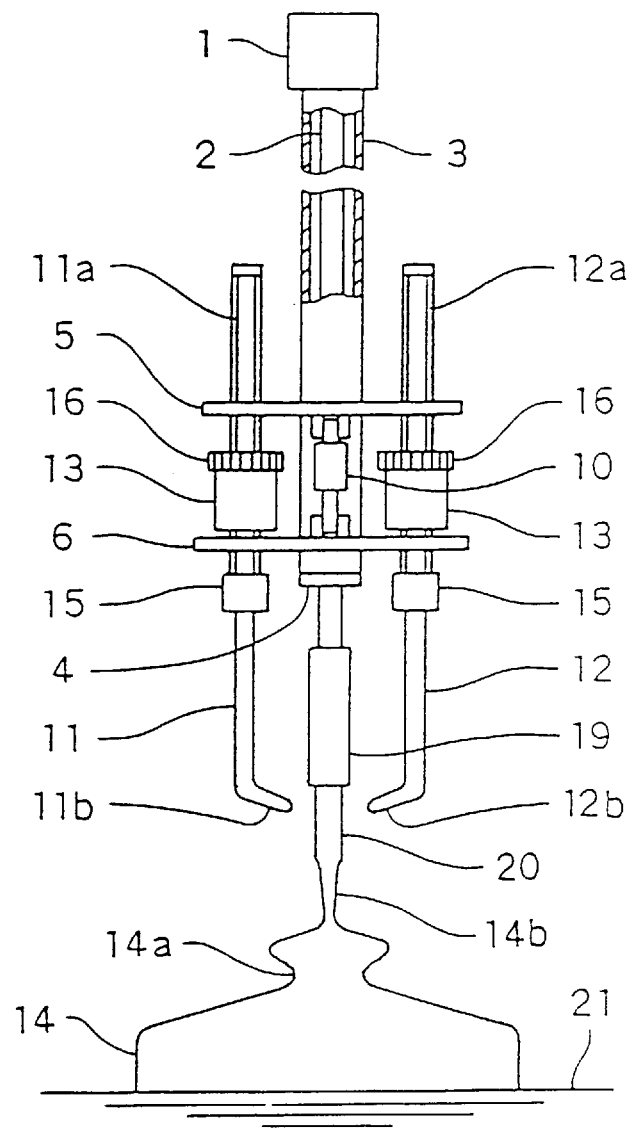
FIG. 1 is a front view showing the schematic structure of the first embodiment of a device for manufacturing semiconductor single crystals according to this invention.
Figure 2:
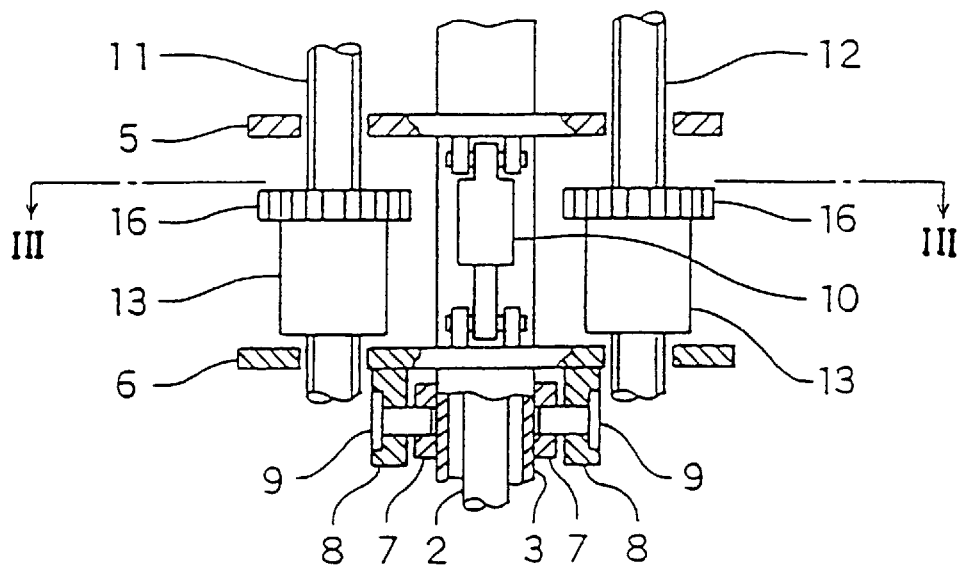
FIG. 2 is a cross-sectional diagram showing the structure of the holding mechanism supporting plate.
Figure 3:
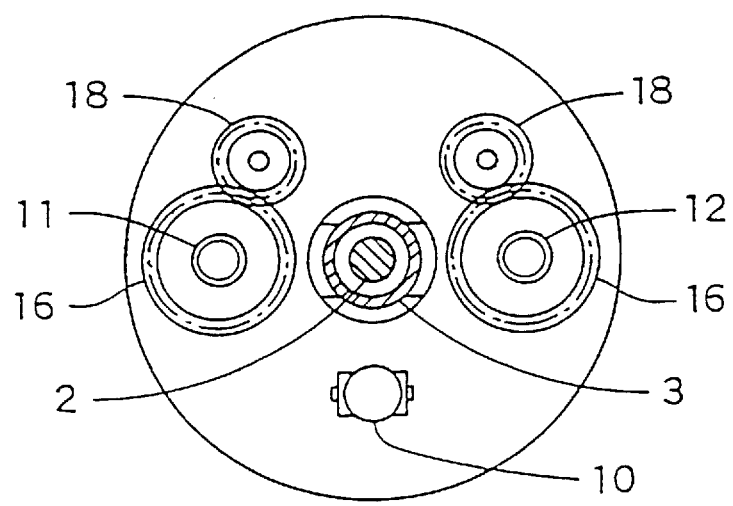
FIG. 3 is a cross-sectional view along the line III—III of FIG. 2.
Figure 4:
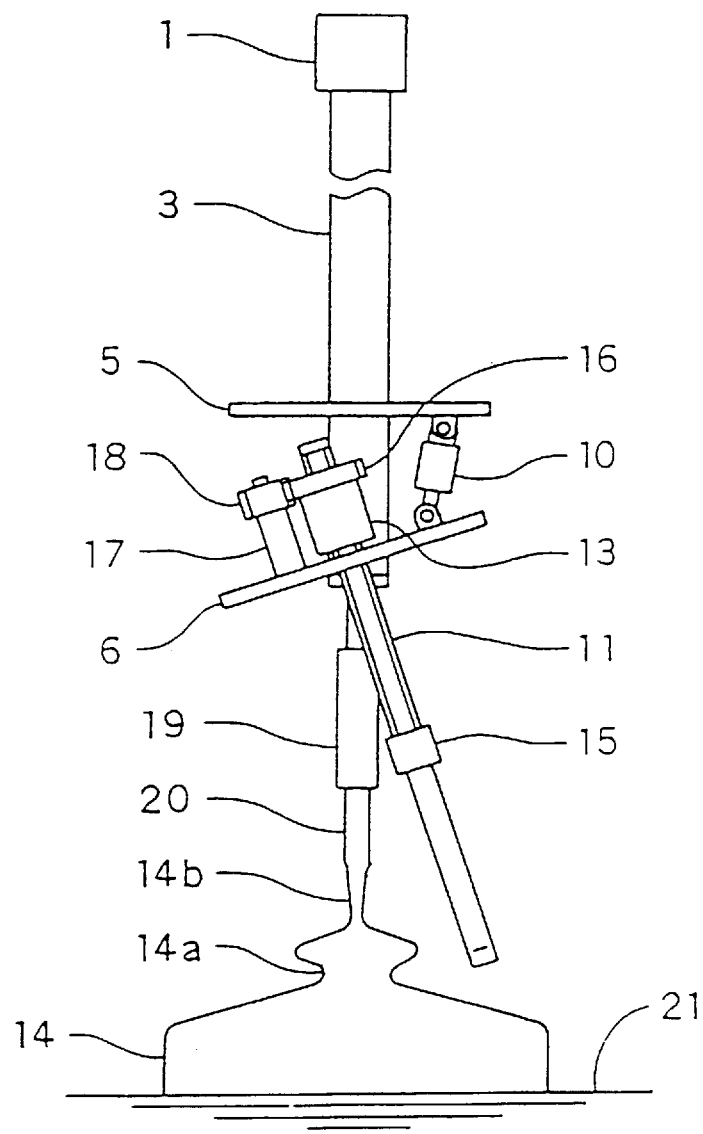
FIG. 4 is a side view schematically showing the state of a swung holding rod.

The method and the device for lifting single crystals according to this invention can be more fully understood by reading the detailed description and embodiments with references made to the accompanying drawings. FIG. 1 is a front view showing the schematic structure of the first embodiment of a device for manufacturing semiconductor single crystals according to this invention. FIG. 2 is a cross-sectional diagram showing the structure of the holding mechanism supporting plate. FIG. 3 is a cross-sectional view along the line III—III of FIG. 2. FIG. 4 is a side view schematically showing the holding mechanism supporting plate swung and the holding rod lowered. The above single-crystal lifting device is installed on a shaft-type single-crystal manufacturing apparatus.

The lifting shaft of the semiconductor single-crystal manufacturing equipment is consisted of a force-bar 2 suspended on a weight sensor 1, and a guide shaft 3 disposed around the force-bar 2 and upholding the weight sensor 1. The guide, shaft 3 can be directed to rotate, ascend, or descend together with the force-bar 2 by a rotating and ascending/descending mechanism (not shown). Furthermore, a collar 4 is installed on the lower end of the guide shaft 3 so as to prevent wobbling of the force-bar 2.

A holding mechanism installation plate 5 is fixed on the guide shaft 3, and a holding mechanism supporting plate 6 is installed below the holding mechanism installation plate 5. A hole, which keeps a preset clearance with the guide shaft 3, is formed in the central portion of the holding mechanism supporting plate 6. As shown in FIG. 2, the holding mechanism supporting plate 6 can be swung with respect to the guide shaft 3 by inserting a shaft 9 into bearings 7, 7 and bearings 8, 8. The bearings 7, 7 are fixed on the guide shaft 3, and the bearings 8, 8 are disposed underneath the holding mechanism supporting plate 6 with the bearings 7, 7 located between them. Furthermore, a pneumatic cylinder 10 connects the holding mechanism installation plate 5 and the holding mechanism supporting plate 6.

The upper portions of two holding rods 11, 12 disposed beside the guide shaft 3 are respectively provided with male threaded screws 11a and 12a which are used for matching with ball screw nuts 13, 13. The lower ends of the two holding rods 11, 12 are provided with arms 11b and 12b which are used for engaging with the necked portion 14a of the single crystal 14. Furthermore, weight sensors 15, 15 are installed on the lower ends of the male threaded screws 11a and 12a. As shown in FIGS. 3 and 4, gears 16, 16 are provided on the ball screw nuts 13, 13. And the holding rods 11, 12 can be independently driven to ascend or descend by rotating the drive gears 18 of the motors 17, 17 which are installed on the holding mechanism supporting plate 6. The signals coming from the weight sensor 1 suspending the force-bar 2 and the weight sensors 15, 15 installed on the holding rods 11, 12 are inputted into a control device (not shown) which is installed outside the semiconductor single-crystal manufacturing apparatus. The weight of the single crystal being lifted and the loads, induced by the weight of the single crystal, exerted respectively on the holding rods 11 and 12 can thus be calculated.

The following is a description concerning the method for lifting single crystals.

In the process of manufacturing semiconductor single crystals, a seed-crystal 20 is installed within a seed holder 19 installed on the lower end of the force-bar 2. At first, the holding rods 11 and 12 are raised to their topmost locations by rotating the nuts 13, 13, then the force-bar 2 and the guide shaft 3 are lowered to immerse the seed-crystal 20 into the melted liquid 21. Subsequently, the force-bar 2 and the guide shaft 3 are driven to rotate and ascend so as to form a reduced portion 14b. After making sure that dislocation did not arise, the lifting speed is slowed to enlarge the diameter of the single crystal, then the lifting speed is increased to reduce the diameter of the single crystal so as to form a necked portion 14a. Subsequently, formation of the single crystal 14 proceeds with the shoulder forming process for enlarging its diameter to a preset value, after the procedure shifts to the body forming process.

After shifting the procedure to the shoulder forming process, the pneumatic cylinder 10 is driven to pull back so as to tilt the holding mechanism supporting plate 6 by a preset angle (see FIG. 4). Then, the nuts 13, 13 are rotated to lower the holding rods 11 and 12 to predetermined locations. The above location is intended to be such that when the holding rods 11 and 12 are driven to restore to the vertical attitude, a clearance is produced between the upper surfaces of the arms 11b, 12b and the necked portion 14a.

Figure 5:
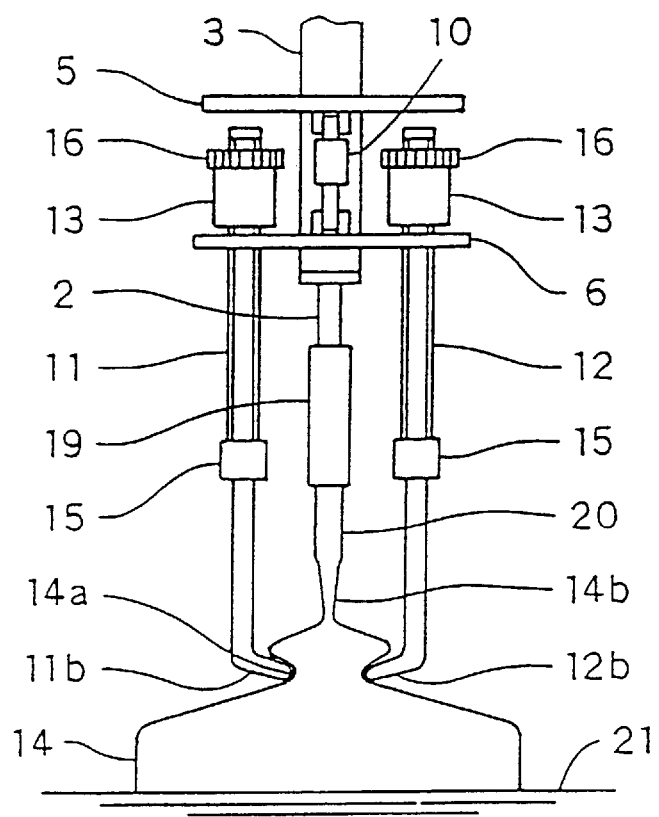
FIG. 5 is a front view schematically showing holding rods engaged with the necked portion of the single crystal.

After making sure that the holding rods 11 and 12 have descended to the preset locations, the pneumatic cylinder 10 is driven to extend so as to restore the holding mechanism supporting plate 6 to a horizontal position. By this operation, the holding rods 11 and 12 are directed to return to the vertical attitude, and the arms 11b, 12b are directed to insert into the necked portion 14a with a clearance existing between the upper surfaces of the arms 11b, 12b and the necked portion 14a. Then, the nuts 13, 13 are slightly rotated to raise the holding rods 11 and 12 with a tiny distance so as to engage the arms 11b, 12b with the necked portion 14a (see FIG. 5). The raised distances of the holding rods 11 and 12 are controlled according to the output signals of the weight sensors 15, 15 installed on the holding rods 11 and 12. Thus, even if the shape of the necked portion 14a is asymmetric with respect to the axis of the single crystal 14, the arms 11b, 12b can be conducted to engage with the necked portion 14a without exerting any mechanical shock or vibration on the single crystal 14.

In the process of lifting the single crystal 14, the motor 17 is controlled in such a way that preset loads are always exerted on the holding rods 11 and 12. A control device (not shown) performs the controlling according to the output signals of the weight sensors 15, 15 installed on the holding rods 11, 12 and the weight sensor 1 suspending the force-bar 2 beneath itself.

Figure 6:
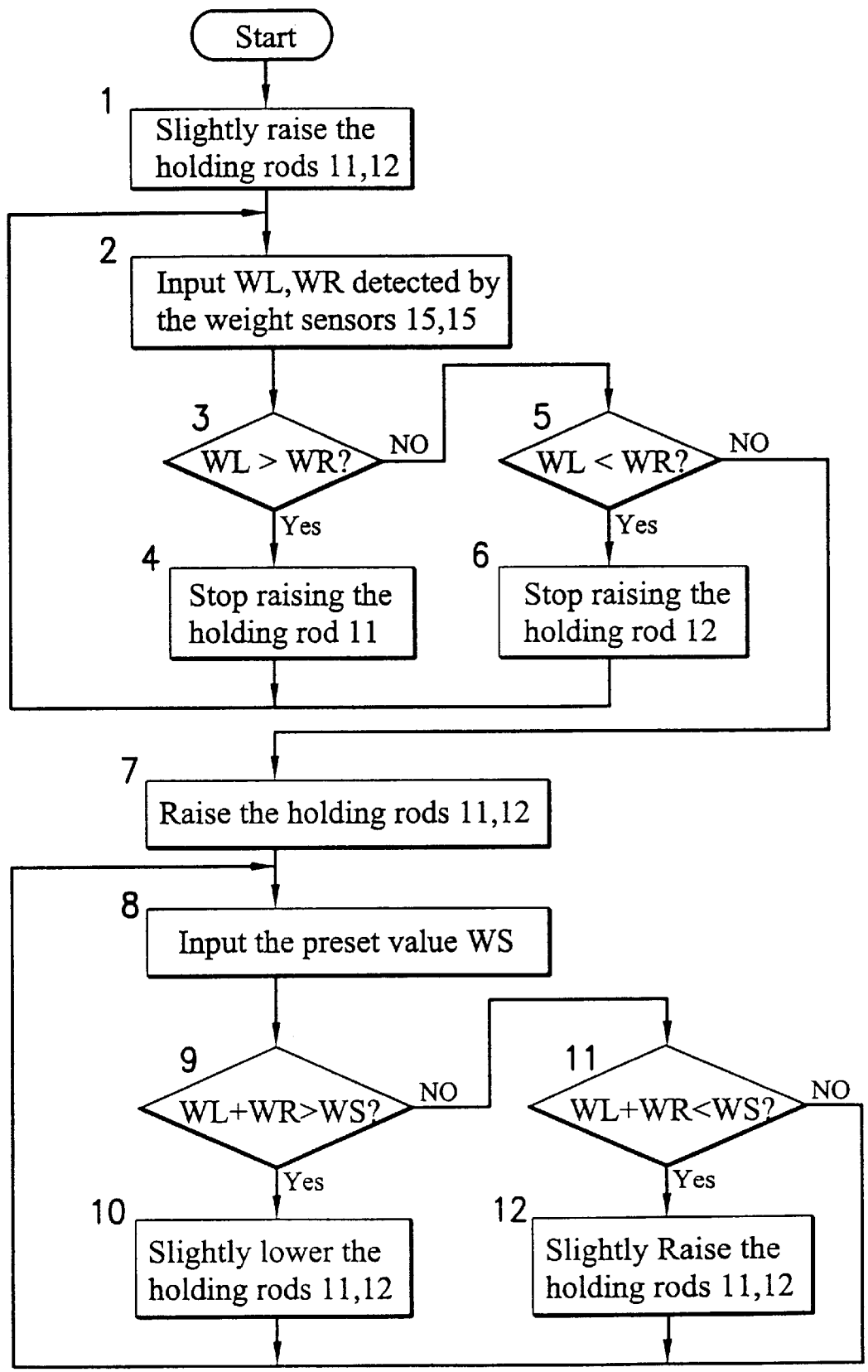
FIG. 6 is a flow chart showing the steps for controlling the ascent and the descent of the holding rods.

FIG. 6 is a flow chart showing the steps for controlling the ascending and the descending of the holding rods after the inserting the arms 11b, 12b into the necked portion 14a. The numerals shown in the left upper sites denote step numbers. At first, in step 1, the motors 17 (see Fig. 4) are trivially rotated to slightly move the holding rods 11 and 12 upward. When the arms 11b, 12b contact the necked portion 14a, loads are detected by the weight sensors 15, 15. Take the load exerted on the arm 11b as WL, and the load exerted on the arm 12b as WR. In step 2, the values WL and WR detected by the weight sensors 15, 15 are inputted into the control device. Then, in step 3, loads exerted on the arms 11b, 12b are compared with each other. If WL>WR, this means the raised distance of the holding rod 11 is larger than that of the holding rod 12. Therefore, in step 4, the motor on the side of the holding rod 11 is stopped to cease the ascent of the holding rod 11, and return to step 2. Furthermore, in step 5, If WL<WR, this means the raised distance of the holding rod 12 is larger than that of the holding rod 11. Therefore, in step 6, the motor on the side of the holding rod 12 is stopped to cease the ascent of the holding rod 12, and return to step 2. The rest is WL=WR, it means that the arms 11b, 12b contact the necked portion with equal loads.

After making sure that the arms 11b, 12b contact the necked portion with equal loads, the procedure is shifted to step 7, and the holding rods 11 and 12 are raised at the same speed. Then, in step 8, a preset load WS is inputted into the control device. The preset load WS is a predetermined value of the load exerted on the holding rods 11 and 12 induced by the single crystal being lifted. Next, in step 9, the load WL+WR exerting on the holding rods 11 and 12 is compared with the preset load WS. If WL+WR>WS, then the process proeceeds to step 10, wherein the holding rods 11 and 12 are slightly lowered so as to keep the real load WL+WR approaching WS. Furthermore, in step 11, if WL+WR<WS, then the process proceeds to step 12, the holding rods 11 and 12 are slightly raised so as to keep the real load WL+WR approaching WS. Should WL+WR〈WS, the holding rods 11 and 12 are kept unmoved. The controlling steps subsequent to step 8 are repeatedly performed until the completion of the single-crystal lifting.

It is also advisable to take the preset load as WS/2, the load exerting on the holding rod 11 as WL, and the load exerting on the holding rod 12 as WR. In the steps subsequent to step 8, WL and WR are respectively compared with WS/2 to maintain the state of WL=WR=WS.

As described above, the necked portion of the single crystal is held by two holding rods disposed respectively at right side and left side. Load is evenly distributed between right side and left side by controlling the raised distances of the two holding rods with the aid of the weight sensors installed on each holding rod. After the holding operation is adjusted to approach a steady state, the two holding rods are raised simultaneously. When the loads exerted on the two holding rods approach a preset value, the operation is kept undeviating. Therefore, even if the shape of the necked portion is asymmetric with respect to the centerline of the lifting shaft, a load offset will not exert on the necked portion. Thus, breakage of the necked portion will not occur and the lifting operation can be performed steadily.

It is also advisable to employ the holding rods 11, 12 as a drop-prevention device when breakage of the reduced portion 14b occurs. Namely, the holding rods 11, 12 do not share the weight of the single crystal being lifted, and only the reduced portion 14b bears the weight of the single crystal 14 being lifted. At that point, the motors 17, 17 continuously apply torque, or alternatively motors with brakes are employed, so as to keep the arms 11b, 12b of the holding rods 11, 12 in contact with the necked portion 14a.

At the start of forming the body, should dislocation or polycrystallization occasionally occur for some unknown reason, then lifting of the single crystal 14 (see FIG. 5) has to be stopped and re-melting of the solidified portion has to be done. At that time, the solidified portion is dipped into the melted liquid 21, then the nuts 13, 13 are driven to rotate by the motors 17, 17 so as to slightly lower the holding rods 11, 12. Then, the pneumatic cylinder 10 is driven to retract so as to slant the holding mechanism supporting plate 6 and release after the arms 11b, 12b depart from the necked portion 14a. Subsequently, the single crystal 14 can be re-melted up to the reduced portion 14b. The seed crystal 20 can be once more dipped into the melted liquid 21 to form the reduced portion 14b and the necked portion 14a. Then, the holding rods 11, 12 can be driven to engage with the necked portion 14a following the above-described procedures so as to lift the single crystal 14.

Figure 7:
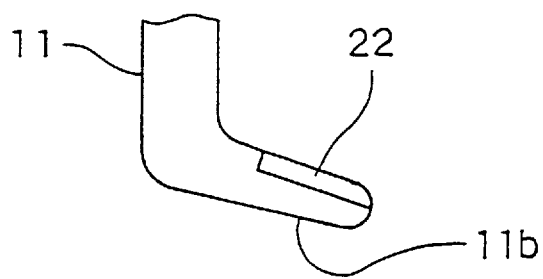
FIG. 7 is a drawing showing the structure of the lower end of a holding rod in the second embodiment according to this invention.

FIG. 7 is a drawing that depicts the structure of the lower end of a holding rod in the second embodiment according to this invention. A shock absorbing material 22 made of, for example borosilicate glass is installed on the arm 11b of the holding rod 11. The other holding rod 12 also has the same structure. If borosilicate glass is used as shock absorbing material, the holding rods engage and hold the necked portion within a temperature zone (330° C.–500° C.) above the glass transition point, wherein the glass maintains a proper adhesive resiliency. By this arrangement, mechanical shock can be easily avoided.

Figure 8:
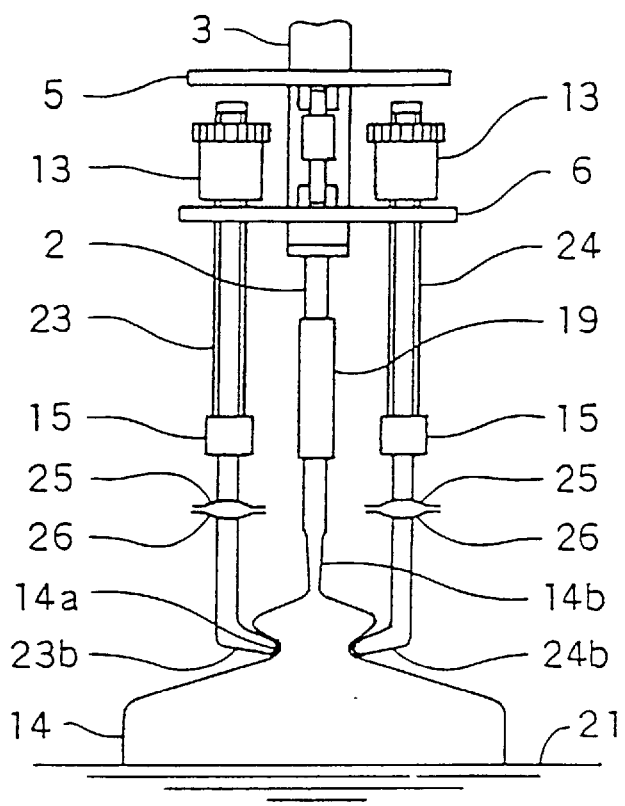
FIG. 8 is a front view showing the schematic structure of the third embodiment according to this invention.

FIG. 8 is a front view showing the schematic structure of the third embodiment according to this invention. Each of the holding rods 23, 24 is divided at a location between the weight sensors 15, 15 and the arms 23b, 24b, and each is connected by the plate springs 25, 26 respectively installed on the divided surfaces. By employing the plate springs 25, 26, the mechanical shock induced by the operation of holding the necked portion 14a of the single crystal 14 can be avoided, and any jerking force in the longitudinal direction can be absorbed.

Figures 9A, 9B:
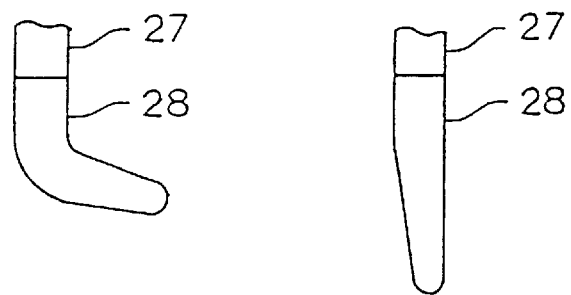
FIGS. 9(*a*) and 9(*b*) are diagrams showing the engaging members installed on the lower ends of holding rods in the fourth embodiment according to this invention.

The fourth embodiment according to this invention is shown in FIGS. 9(a) and 9(b). As shown in FIGS. 9(a) and 9(b), the arm of the holding rod 27 is removed and an engaging member 28 is installed on the lower end of the holding rod 27. The engaging member 28 is made of shape memory alloy such as Cu—Zn—Al alloy whose transition temperature is 350° C. Below the transition temperature, the shape of the engaging member 28 is of the shape shown in FIG. 9(a). The structure of the holding rod 27 except for the engaging member 28 is the same as that of the first embodiment. When the single crystal is lifted to an height where the temperature of the necked portion drops down to a value less than 350° C., the engaging member 28 engages with the necked portion to hold the single crystal being lifted. Furthermore, when re-melting the single crystal, the solidified portion is dipped into the melted liquid and the force-bar and the guide shaft are lowered. The bending portions of the engaging member 28 will extend gradually to release the necked portion when the temperature exceeds 350° C., and finally will become the shape shown in FIG. 9(b). Therefore, the engaging member 28 disengages with the necked portion during the above process, and the arms engage and disengage extremely easily during the re-melting operation.

FIG. 10 is a cross sectional view of a rising/lowering mechanism for the holding rod 11 or 12. As shown in this figure, a motor 29 and nut 13 are fixed on the holding mechanism supporting plate 6. The drive gear 18 is fixed to the shaft of the motor 29. The gear 16 is supported by the nut 13 by means of bearings 30a, 30b, 30c, and is meshed with the gear 18. A cylindrical hole is formed at the center of the gear 16. The inner wall of the cylindrical hole is provided with a female threaded screw 16a, which is engaged with the male threaded screw 11a, 12a of the holding rod 11, 12. Because the gear 16 is supported by the nut 13, when the gear 16 is rotated by the rotation of the motor 29, and then the holding rod 11 or 12 rises or lowers.

Figure 11:
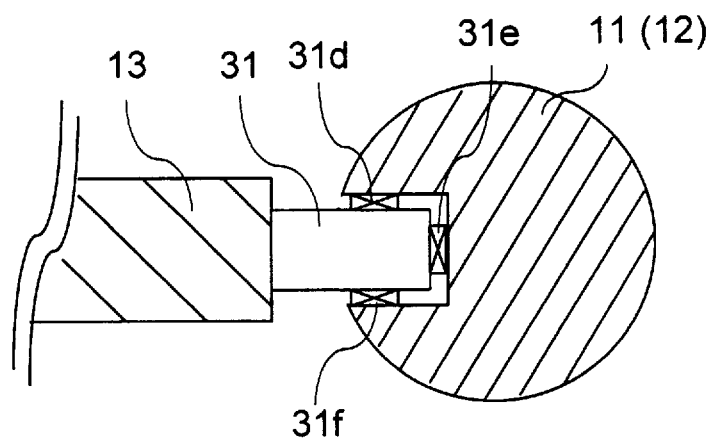
FIG. 11 is a cross sectional view of the along the line XI—XI of FIG. 10.

FIG. 11 is a cross sectional view of the along the line XI—XI of FIG. 10. As shown in this figure, a key 31 is attached to the nuts 13 and a ditch is formed along the whole length of the upper portion of the holding rods 11, 12. The key 31 is fitted into the ditch by way of bearings 31d, 31e, 31f. With this construction, the holding rod 11 or 12 rises or lowers without rotating by the rotation of the gear 16.

Figure 12:
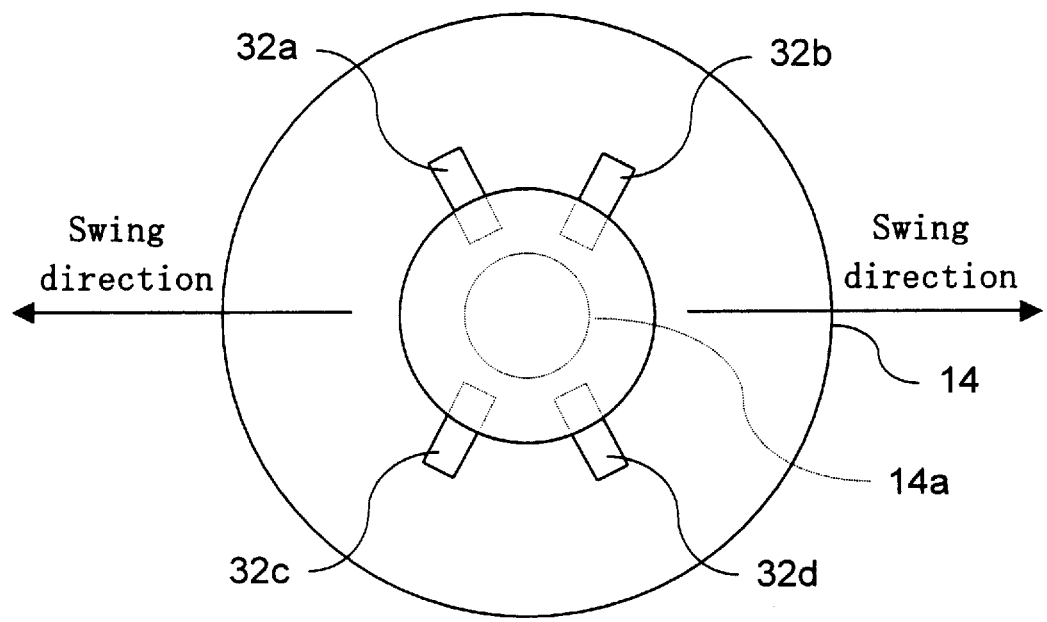
FIG. 12 is a schematic view showing an example where four holding rods are used.

In the above-described embodiment, the lifting apparatus has two holding rods. Alternatively, it has more than two holding rods. FIG. 12 schematically shows an example where four holding rods are used, in which 32a, 32b, 32c, 32d indicate the clamp arms of four holding rods. As shown in this figure, the clamp arms are not equally distributed. Specifically, the angle between the clamp arm 32a and the clamp arm 32b so that clamp arms are not collide with the necked portion 14a when the holding rods are swung.

According to this invention, the necked portion of a semiconductor single crystal lifted by the CZ method, is held by two holding rods capable of ascending, descending and swinging, and the single crystal is lifted by simultaneously detecting the loads exerting on the two holding rods. Therefore, no load offset will be exerted on the necked portion, thereby preventing breakage of the necked portion or dropping of the single crystal. Although, the range of the single crystal rotation speed will be restrained, if the holding device of this invention is installed on a wire-type semiconductor singlecrystal manufacturing apparatus, no such restrictions pertain to the single-crystal lifting device if it is installed on a shaft-type manufacturing apparatus. In addition, it will be more effective, if shock-absorbing material is employed on the holding portions or springs are installed on the holding rods. Furthermore, if polycrystallization of the single crystal being lifted or dislocation occur so that lifting has to be stopped to re-melt the single crystal, disengagement of the holding rods is very easy and re-melting can be performed rapidly.

What is claimed is:

1. A device for lifting single crystal, which is installed on a semiconductor single-crystal manufacturing apparatus that utilizes the CZ method, characterized in that a necked portion formed on the top of shoulder of the single crystal is held by at least two holding rods, and said holding rods are suspended on a guide shaft to enable them to swing in the same direction on different parallel vertical planes.

2. A device for lifting single crystal as claimed in claim 1, wherein the holding rods are capable of being individually controlled to ascend or descend with respect to the force-bar, and each of the force-bar and the holding rods are each provided with a weight sensor.

3. A device for lifting single crystal as claimed in claim 1, wherein shock-absorbing material is provided on portions of the holding rods, which are designed to contact with the necked portion of the single crystal.

4. A device for lifting single crystal as claimed in claim 1, wherein each of the holding rods consist of two parts which are connected to each other by means of a plate spring.

5. A device for lifting single crystal as claimed in claim 1, wherein portions of the holding rods, which are designed to come into contact with the necked portion of the single crystal, are made of a shape memory alloy.

6. A method for lifting single crystal characterized in that when a detected value coming form a weight sensor suspending a force-bar reaches a preset value, holding rods swing in the same direction on different parallel vertical planes with respect to the force-bar; and the holding rods are lowered; then the holding rods are directed to return to the vertical attitude; and subsequently the holding rods are guided to insert onto a necked portion of the single crystal while maintaining a certain clearance existing between the necked portion and the holding rods; and then the holding rods engage with the necked portion.

7. A method for lifting single crystals as claimed in claim 6, wherein after the holding rods are inserted into the necked portion, the holding rods are controlled to ascend according to detected values by weight sensors installed on the holding rods.

* * * * *